United States Patent [19]

Rosotker

[11] Patent Number: 5,329,157
[45] Date of Patent: Jul. 12, 1994

[54] SEMICONDUCTOR PACKAGING TECHNIQUE YIELDING INCREASED INNER LEAD COUNT FOR A GIVEN DIE-RECEIVING AREA

[75] Inventor: Michael D. Rosotker, San Jose, Calif.

[73] Assignee: LSI Logic Corporation, Milpitas, Calif.

[21] Appl. No.: 933,430

[22] Filed: Aug. 21, 1992

Related U.S. Application Data

[63] Continuation-in-part of Ser. No. 916,328, Jul. 17, 1992.

[51] Int. Cl.$^5$ ............................................. H01L 29/40
[52] U.S. Cl. ..................................... 257/666; 257/786
[58] Field of Search ..................... 257/690, 692–695, 257/697, 786, 666, 668, 673, 734, 784

[56] References Cited

U.S. PATENT DOCUMENTS

| | | | |
|---|---|---|---|
| 3,169,837 | 2/1965 | Moross et al. | 257/620 |
| 4,253,280 | 3/1981 | Du Bois et al. | 51/283 R |
| 4,413,404 | 11/1983 | Burns | 257/668 |
| 4,542,397 | 9/1985 | Biegelsen et al. | 357/32 |
| 4,771,330 | 9/1988 | Long | 357/80 |
| 4,903,114 | 2/1990 | Aoki et al. | 357/70 |
| 4,918,614 | 4/1990 | Modarres et al. | 364/490 |
| 5,173,369 | 12/1992 | Kataoka | 257/735 |
| 5,182,233 | 1/1993 | Inoue | 437/226 |
| 5,233,220 | 8/1993 | Lamson et al. | 257/666 |

FOREIGN PATENT DOCUMENTS

| | | | |
|---|---|---|---|
| 0247644 | 12/1987 | European Pat. Off. | 23/48 |
| 0259222 | 3/1988 | European Pat. Off. | 23/50 |
| 0311513 | 4/1989 | European Pat. Off. | 23/50 |
| 3048362 | 7/1982 | Fed. Rep. of Germany | 437/226 |
| 0007471 | 1/1981 | Japan | 437/227 |
| 0058234 | 5/1981 | Japan | 437/226 |
| 0122175 | 9/1981 | Japan | 257/620 |
| 0143844 | 9/1982 | Japan | 21/78 |
| 0207646 | 12/1983 | Japan | 257/786 |
| 0270245 | 10/1989 | Japan | 437/227 |
| 0280448 | 12/1991 | Japan | 437/226 |
| 0162640 | 6/1992 | Japan | 257/666 |
| 2196475 | 4/1988 | United Kingdom | 257/666 |

OTHER PUBLICATIONS

W. Ward, Volume Production of Unique Plastic Surface-Mount Modules for the IBM 80-ns 1-Mbit DRAM Chip by Area Bond Techniques, IEEE, 1988, pp. 552–557.

*Primary Examiner*—Rolf Hille
*Assistant Examiner*—Peter Toby Brown
*Attorney, Agent, or Firm*—Gerald E. Linden

[57] ABSTRACT

A greater lead count for a given die area can be achieved with "certain non-square" geometries formed by the inner ends of conductive lines. These include various triangular configurations, as well as "greatly elongated" rectangular, parallelogram and trapezoidal configurations. The conductive lines may be leads of a lead frame, leads on a tape-based package, or traces on ceramic or PCB-substrate packages. The package body may be formed to have a shape similar to that of the die receiving area, and may also be provided with external pins, ball bumps or leads. A number of these "certain non-square" packages may be assembled in an electronic system on a mother board. Unpackaged "certain non-square" dies may be connected to the ends of traces on a substrate, and encapsulated to form a multi-chip module.

18 Claims, 10 Drawing Sheets

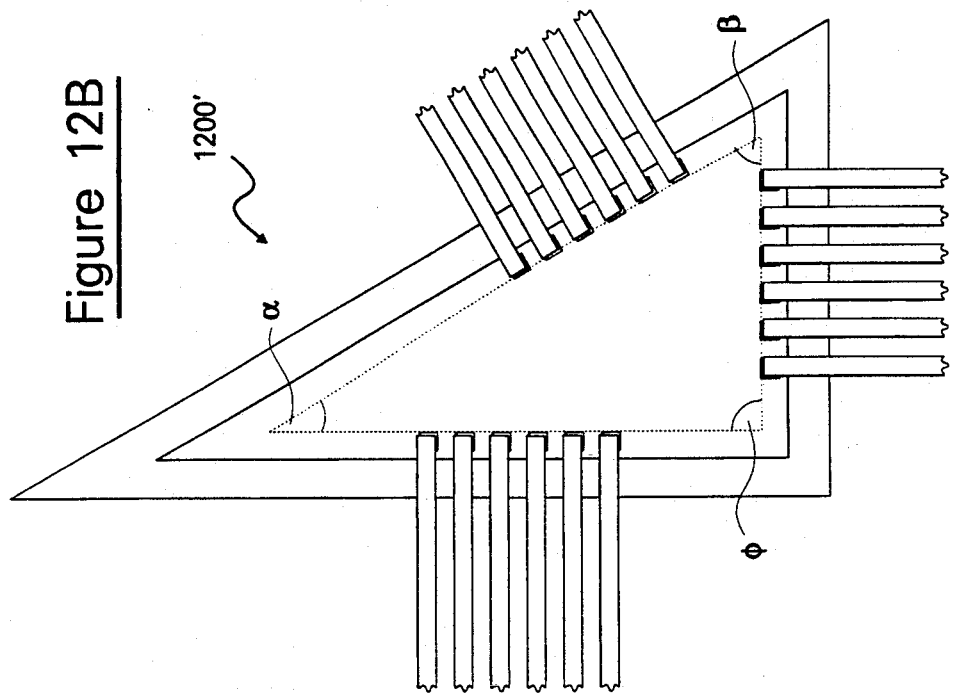
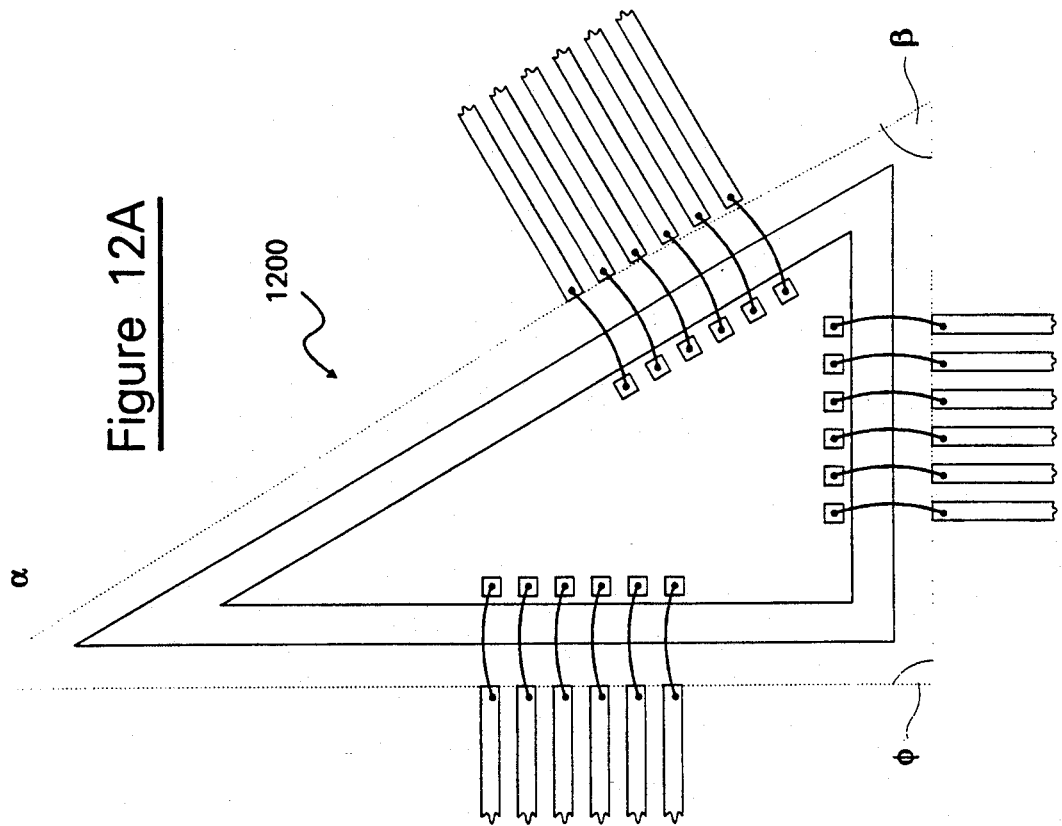

SEMICONDUCTOR PACKAGING TECHNIQUE YIELDING INCREASED INNER LEAD COUNT FOR A GIVEN DIE-RECEIVING AREA

CROSS-REFERENCE TO RELATED APPLICATIONS

This is a continuation-in-part of commonly-owned, co-pending U.S. patent application Ser. No. 916,328, filed Jul. 17, 1992 by Michael D. Rostoker.

TECHNICAL FIELD OF THE INVENTION

The invention relates to mounting and packaging an integrated circuit (IC) die.

BACKGROUND OF THE INVENTION

The functional demands placed on modern integrated circuits have resulted in an ever-increasing demand for input/output (I/O) connections to the die. Hundreds of I/O connections are not uncommon. Commonly-owned, co-pending U.S. patent application Ser. No. 916,328 ("parent case"), discussed below, discloses a method for increasing I/O connections for an integrated circuit (die) of a given area. There remains a similar problem with the number of connections required in the package mounting and connecting to the die. Generally, there is a one-to-one correspondence between the number of package connections and the number of bond pads on the die.

Thus, there is a need for semiconductor packaging techniques that can accommodate increased lead count, particularly suited to the dies discussed in the aforementioned U.S. patent application No. 916,328.

Generally, semiconductor packages are used for (1) enclosing (protecting) a semiconductor (IC) die in some kind of package body, and (2) providing external connections for connecting the packaged die to external systems. Packaging the integrated circuit, requires at a minimum, (1) a conductive layer having a plurality of conductive lines, and (2) a "die-receiving area." As is discussed in greater detail hereinbelow, the inner ends of the conductive lines define the die-receiving area.

Once the die is mounted in (on) the die-receiving area, bond pads located on the die will be connected, usually by wire bonding or tape automated bonding (TAB) to inner end portions of the conductive lines.

Generally speaking, there are four distinct techniques of packaging a semiconductor device, in any case said package having one or more layers of conductive lines (leads, traces, or the like) exiting the package for electrically connecting the packaged die to other components, whether by mounting directly to a printed circuit (mother) board or by plugging the packaged device into a socket which in turn is mounted to the mother board. These are:
  (1) plastic molding;
  (2) ceramic packaging;
  (3) PCB-substrate type packaging; and
  (4) tape-based packaging.

Plastic molding typically involves a relatively rigid lead frame, wherein the lead frame has a patterned layer of conductive leads (conductive lines), the inner ends of which define the die-receiving area. A die is mounted to a die paddle, within the die-receiving area, and is connected to inner end portions of the conductive leads. The die and inner portion of the lead frame are encapsulated by plastic molding compound. Outer end portions of the conductive leads extend outside of the molded plastic body.

Ceramic packaging typically involves one or more layers of conductive traces (conductive lines) applied on interleaved ceramic layers. Again, the die-receiving area is defined by the inner ends of the conductive traces. Outer layers are typically ceramic. The die is mounted in a cavity (either up or down), connected to inner ends of the traces, and the cavity is closed by a lid. Outer ends of the traces are connected, within the ceramic, to external pins or leads (for example) on the exterior of the ceramic package body.

PCB-substrate type packaging involves a patterned layer of conductive traces (conductive lines) on a printed circuit board (PCB) substrate, and the inner ends of the conductive traces define the die-receiving area. The die is mounted to the substrate, connected to the inner ends of the traces, and may be encapsulated by epoxy, plastic molding compound, or in any suitable manner. Outer ends of the traces are connected to external pins or leads (for example), in a manner similar to ceramic packaging.

Tape-based packing involves a relatively non-rigid foil of conductive leads (conductive lines), supported by a plastic layer, and the inner ends of the conductive traces define the die-receiving area. A die is mounted to the substrate formed by the layer of conductive leads and plastic, and is connected to the inner ends of the conductive leads. Outer ends of the leads are connected to (or form) external interconnects for the packaged die.

In any of these, or other, packaging techniques, a die connected to conductive lines and having some sort of support and/or package body is referred to as a "semiconductor device assembly".

FIGS. 1A and 1B show two similar prior art layers 100, 100' of pattered conductive lines, which are applicable to any of the aforementioned package types. A "die-receiving area" 110, 110' is defined by the inner ends 108, 108' of a plurality of conductive lines 106, 106'. A die 102, 102' is mounted in the die-receiving area 110, 110', and bond pads 112, 112' on the die are connected to the inner ends of the conductive lines. Two techniques for attaching a die to conductive lines are shown. In FIG. 1A, the die 102 is wire bonded to the conductive lines 106, as indicated by bond wires 114 extending between the bond pads 112 and the conductive lines 106. In FIG. 1B, the die 102' is connected to the conductive lines 106' by tape automated bonding (TAB) techniques (indicated by 114'). Both of these techniques are well known. Other techniques (not shown) of connecting a die to a pattern of conductive lines include flip-chip and the like.

Notably, as shown in FIGS. 1A and 1B, the die is square. The conductive lines extend (radiate) from the die-receiving area, outward from the die. Hence, a sub-plurality of conductive lines are disposed on each of the four sides of the die, their inner ends defining a square die-receiving area. Also shown, by way of example, in FIGS. 1A and 1B are die attach pads 104, 104', which are generally somewhat larger than the die and somewhat smaller than the die-receiving area.

The conductive lines (106 and 106') include, but are not limited to, lead frame leads, tape leads, and traces on a ceramic or PCB substrate. Ultimately, a package body (not shown) may be formed about the die and inner portions of the conductive lines, as discussed above.

As a practical matter, the number of conductive lines (106 and 106') is determined by the number of bond pads (112 and 112') located on a given die (102 and 102'). A problem with the prior art is insufficient number of conductive lines (106 and 106').

Commonly owned, co-pending application Ser. No. 916,328 provides a technique for increasing the number of I/O bond pads for a given die. Hence, it is desirable to provide an increased number of conductive lines, defining a die-receiving area and connecting to the die bond pads, hence increasing the number of I/O connections.

Therefore, problems with mounting a die within a prior art square die-receiving area is the limitation placed on the number of conductive lines (106 and 106') defining the prior art square die-receiving area (e.g., 110 and 110'). Prior art inner ends (108 and 108') of conductive lines (106 and 106') make up a square die-receiving area, hence, providing I/O connection limited to the periphery of the square. Moreover, the prior art square die-receiving area does not accommodate the increased number of I/O connection on a given die provided in commonly owned co-pending patent application Ser. No. 916,328. Hence, what is needed is (at least) a layer of conductive lines defining a die-receiving area that provides an increased number of conductive lines, thus increasing the number of I/O connections.

Relation to Parent Case

This invention is similar, in concept, to commonly owned, co-pending U.S. patent application Ser. No. 916,328 ("parent case") in that there is a recognition that certain geometric shapes exhibit a greater ratio of periphery:area than squares. In the context of making I/O connections to an integrated circuit die, this geometric relationship can be used to great advantage.

As set forth in the parent case, the demands placed on modern integrated circuits are headed in two directions:
1. Fitting (fabricating) as many active elements as possible in the active element area, to create more complex devices; and
2. Fitting as many bond pads as possible in an I/O area, typically around the perimeter of the die, to accommodate an increased number of I/O connections.

To satisfy these demands, the parent case discloses what is generally termed "certain non-square" dies that provide an increase in the number of bond pads for a die of a given size (area). As disclosed in the parent case, these "certain non-square" dies include, inter alia:
(1) equilateral triangular shaped dies providing 14% more I/O than a square die of the same size (area);
(2) right isosceles triangular shaped dies providing 21% more I/O than a square die of the same size (area);
(3) 30°-60°-90° right triangular shaped dies providing 28% more I/O than a square die of the same
(4) "Greatly Elongated Rectangular" shaped dies providing 16% more I/O than a square die of the same size (area); and
(5) Parallelogram shaped dies providing 14% more I/O than a square die of the same size (area).

The teachings of the parent case provides for certain non-square dies that yield an increased number of bond pads in the I/O area, and hence, a more efficient utilization of the active element area. As illustrated therein, certain non-square dies will provide an increased number of bond pads in the I/O area, hence, allowing for an increase in connections to conductive lines of the lead frame (e.g.), hence, increasing the number of I/O connections available for a semiconductor package. However, the prior art technique of packaging semiconductor dies provides for a square (or not greatly elongated rectangular) die-receiving area. A square die-receiving area will not have sufficient conductive lines to accommodate the increased number of bond pads in certain non-square dies. Furthermore, as will be shown hereinbelow, geometric configurations of a prior art square die-receiving area provides for fewer conductive lines than certain non-square die-receiving areas of the present invention.

Prior art semiconductor packaging techniques do not provide for mounting certain non-square dies. For example, the prior art would not permit certain non-square dies to be mounted conveniently in the prior art square die-receiving area. For one thing, many of the bond wires (e.g.) would be excessively long, since there is not a good fit between triangles (e.g.) and squares (e.g.). The industry is in need of a semiconductor package having a die-receiving area that provides an increased number of conductive lines, and that will accommodate the packaging of the certain non-square dies disclosed in the parent case and satisfying the demands for increased I/O connections.

DISCLOSURE OF THE INVENTION

It is therefore an object of the present invention to provide an improved technique for packaging semiconductor devices (dies).

It is another object of the present invention to provide a layer of conductive lines having an increased number of conductive lines for given die-receiving area.

It is another object of the present invention to provide "certain non-square" die-receiving areas corresponding to "certain non-square" dies.

It is another object of the present invention to provide a semiconductor package having a certain non-square die-receiving area corresponding to a certain non-square die.

It is another object of the present invention to provide a semiconductor package having increased conductive lines for increased I/O connections.

It is another object of the present invention to provide semiconductor packages that layout more efficiently on a given printed circuit (mother) board.

According to the invention, a layer of conductive lines are patterned to define a certain non-square die-receiving area for mounting a certain non-square die.

According to an aspect of the present invention, the conductive lines define a triangular die-receiving area for mounting triangular dies.

According to another aspect of the present invention, conductive lines define a parallelogram shaped die-receiving area for mounting parallelogram shaped dies.

According to another aspect of the present invention, conductive lines define a greatly elongated rectangular shaped die-receiving area for mounting greatly elongated rectangular shaped dies.

According to another aspect of the present invention, conductive lines define a trapezoidal shaped die-receiving area for mounting greatly elongated rectangular shaped dies.

According to another aspect of the present invention, any of the geometric shapes formed by the inner ends of the conductive lines are applicable to lead frame leads, conductive traces, and the like, in various forms of semiconductor packaging.

Generally, the outside shape of a package body containing the die may be square, rectangular (not greatly elongated) or any other "traditional" shape.

According to another aspect of the present invention, a package body is formed, and the external shape of the package is similar to the shape of the die-receiving area formed by the inner ends of the conductive lines. Inasmuch as the die-receiving areas are termed "certain non-square", these packages are also "certain non-square".

According to another aspect of the present invention, a number of "certain non-square" packages are laid out more efficiently on a printed circuit (mother) board.

Other objects, features and advantages of the invention will become apparent in light of the following description thereof.

BRIEF DESCRIPTION OF THE DRAWINGS

FIG. 12A is a plan view diagrammatic representative of a patterned layer of conductive lines, similar to FIG. 2A, the inner ends of the conductive lines forming a 30°/60°/90° triangular die-receiving area, according to the present invention, and employing a wire bond technique for connecting a die to the conductive lines.

FIG. 12B is a plan view diagrammic representative of a patterned layer of conductive lines, similar to FIG. 2B, the inner ends of the conductive lines forming a 30°/60°/90° triangular die-receiving area, according to the present invention, and employing a Tape Automatic Bonding technique for connecting a die to the conductive lines.

DETAILED DESCRIPTION OF THE INVENTION

The following terms are used in the description that follows:

Die—A semiconductor integrated circuit (IC).

Package—Any means of supporting, enclosing, and connecting a die to an external system.

Conductive Line—Any of a number of means, such as conductive leads and conductive traces, for connecting to a semiconductor die.

Die-receiving Area—The area defined by the inner ends of the conductive lines whereby a semiconductor die is mounted.

Inner Lead Count—The number of inner ends of conductive lines defining the die-receiving area.

Certain non-square configurations—Includes triangular (e.g., equilateral triangle, right isosceles triangle, and 30°-60°-90° triangle), "greatly elongated rectangular" shaped, parallelogram shaped, and trapezoidal shaped. See also commonly owned, copending application Ser. No. 916,328.

Greatly Elongated Rectangular—Includes rectangular shapes having a base:height (length:width) ratio of at least 3:1, for example 3.5:1, 4:1, 4.5:1 and 5:1.

Figure 1A:
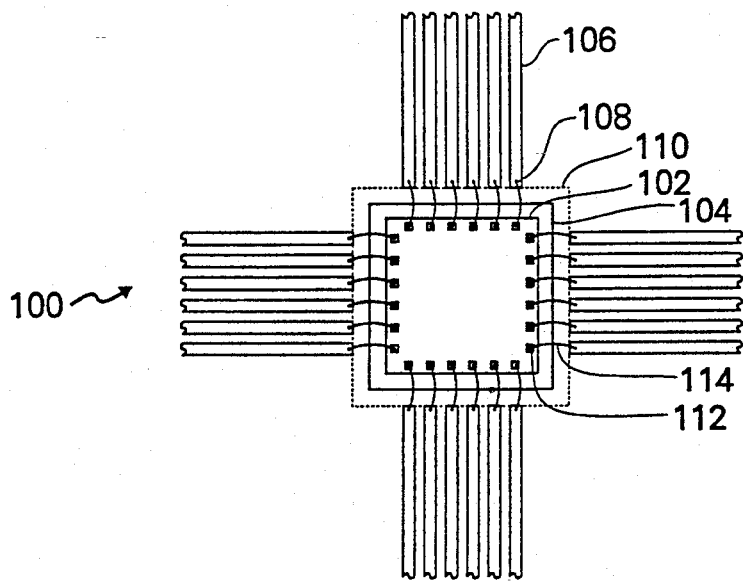
FIG. 1A is a plan view diagrammatic representation of a prior art patterned layer of conductive lines, employing a wire bond technique for connecting a die to the conductive lines.
Figure 1B:
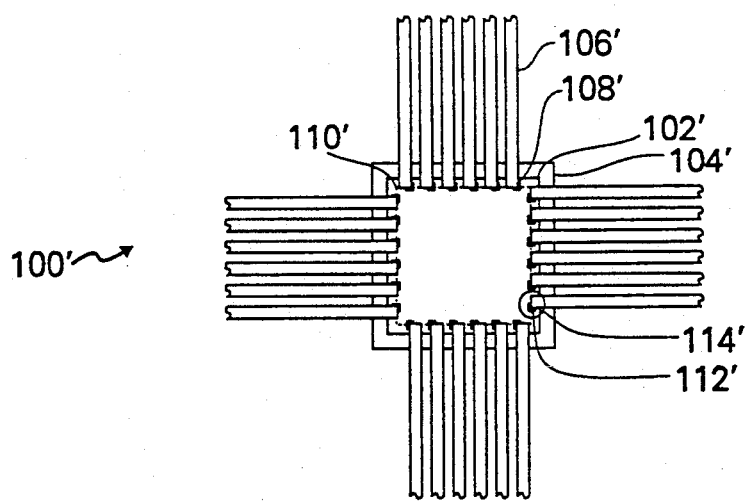
FIG. 1B is a plan view diagrammatic representation of a prior art patterned layer of conductive lines, employing a Tape Automate Bonding technique for connecting a die to the conductive lines.

FIGS. 1A and 1B show prior art (square) die-receiving areas defined by inner ends of conductive lines employing wire bonding and tape automated bonding techniques, respectively, and has been discussed hereinabove. By way of review, the conductive lines may be leads on a lead frame in plastic molded semiconductor packages, leads on a tape substrate, traces on a conductive layer of a ceramic semiconductor package, and traces on a conductive layer on a printed circuit board (PCB) substrate. The prior art square (and non-greatly elongated) die-receiving areas provide an unfavorable ratio of inner lead count ($n_{Lead}$) to die-receiving area ($A_{die}$).

As will be shown hereinbelow, patterned layers of conductive lines defining "certain non-square" die-receiving areas yield an increase in the ratio of inner conductive lines to die-receiving area (e.g., greater ratio of $n_{Lead}{:}A_{die}$).

The number of conductive lines that can be accommodated about the periphery of a die-receiving area is closely related to the perimeter of the die-receiving area. (Throughout this discussion it is assumed that the spacing and pitch of the conductive lines is fixed.) Therefore, according to the present invention, if it is desired to increase the lead count for a given size of die-receiving area (hence, for a die of given area), the perimeter of the die-receiving area must be increased while maintaining the area of the die-receiving area constant. As will be discussed in greater detail hereinbelow, comparisons of prior art square die-receiving areas to certain non-square die-receiving areas will show that certain non-square die-receiving areas provide for increased lead count for a given area (e.g., increased $n_{Lead}{:}A_{die}$).

According to the present invention, certain non-square die-receiving areas having more favorable ratios of perimeter:area ("P:A"), allowing for increased number of inner end conductive lines in the periphery of the die-receiving area. In other words, P:A is closely related to $n_{Lead}{:}A_{die}$.

By way of theoretical application to illustrate the present invention, consider the case of a prior art square die-receiving area (FIG. 1A - 110, and FIG. 1B - 110'), having an area of one "unit$^2$." For a prior art square die-receiving area having four sides, each measuring one unit, the perimeter is four units and the area one unit$^2$. The ratio of the perimeter to area, P:A, for the prior art square die-receiving area is 4:1. According to the present invention, as shown hereinbelow, the ratio of the perimeter to area for certain non-square die-receiving area is greater than 4:1, allowing for an increase in I/O connections (lead count).

CERTAIN NON-SQUARE DIE-RECEIVING AREAS

Figure 2A:
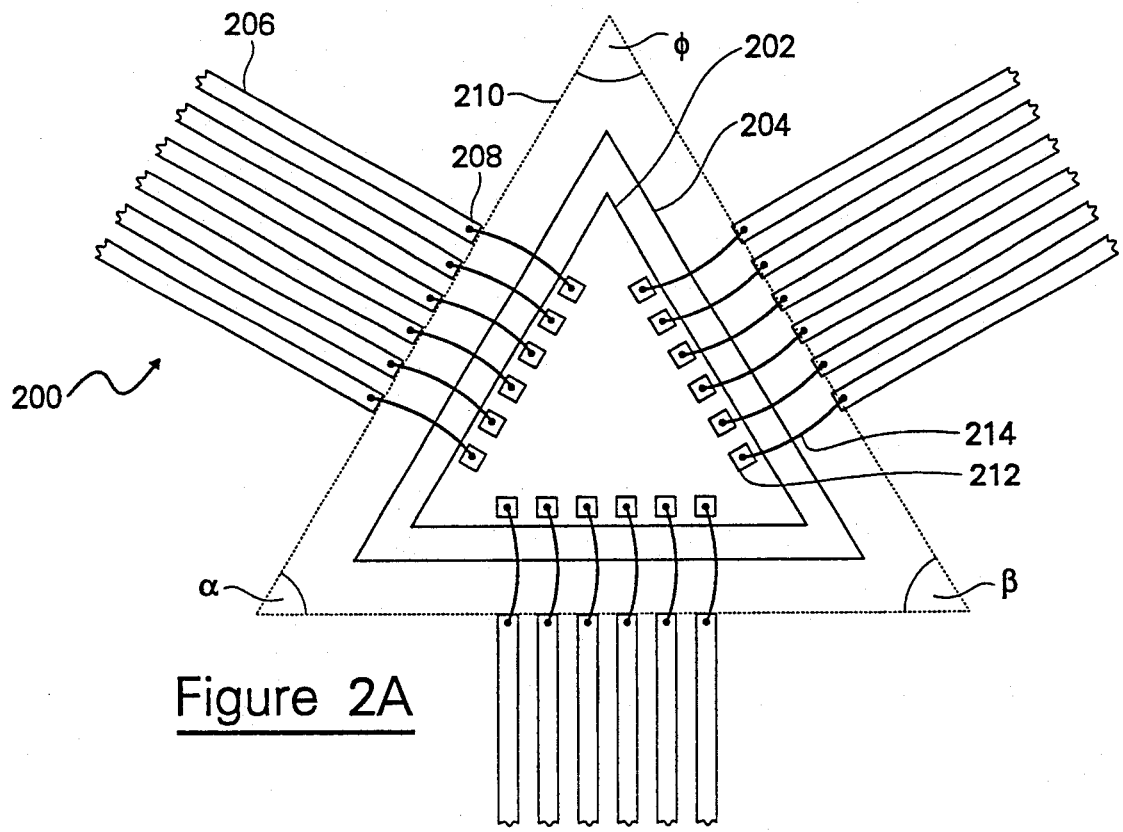
FIG. 2A is a plan view diagrammatic representation of a patterned layer of conductive lines, the inner ends of the conductive lines forming a triangular die-receiving area, according to the present invention, and employing a wire bond technique for connecting a die to the conductive lines.
Figure 2B:
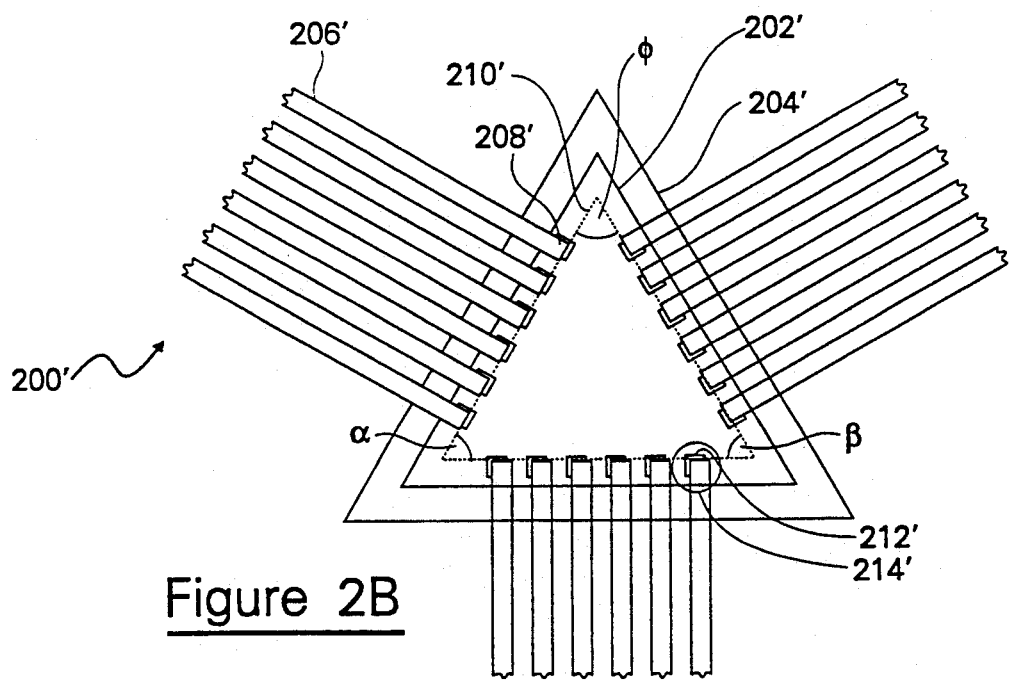
FIG. 2B is a plan view diagrammatic representation of a patterned layer of conductive lines, the inner ends of the conductive lines forming a triangular die-receiving area, according to the present invention, and employing a Tape Automate Bonding technique for connecting a die to the conductive lines.

FIGS. 2A and 2B illustrate one embodiment 200, 200' of the present invention. A triangular die-receiving area 210, 210' is defined by inner ends 208, 208' of conductive lines 206, 206' radiating from the three sides of the die-receiving area. A die 202, 202' is mounted within the die receiving area 210, 210'. Bond pads 212, 212' on the die 202, 202' are connected to the inner ends 208, 208' of the conductive lines 206, 206'. In FIG. 2A, bond wires 214 connect the bond pads 212 to the inner ends 208 of the conductive lines 206. In FIG. 2B, the inner ends 208' of the conductive lines 206' are tape automated bonded (TABbed), indicated by 214', to the bond pads 212' on the die 202'. Other techniques (not shown) of connecting a die to a pattern of conductive lines, such as flip-chip are known. The particular method of connecting the die to the pattern of conductive lines, or conductive pads (not shown) should not be construed as limiting the scope of the present invention.

It should be understood that the conductive lines (206 and 206') include but are not limited to, lead frame leads (plastic packaging), leads in tape-based packaging, patterned traces in conductive layers (ceramic packaging), or patterned traces in a PCB-type substrate. This will be shown, hereinbelow. The die and inner end portions of the conductive lines are usually enclosed within a package body (not shown). Various package body types are discussed hereinbelow.

It should be understood that a relatively small number of conductive lines (206 and 206') are shown, for illustrative clarity, and that there may up to a hundred, or more, conductive lines on each side of the die.

FIGS. 2A and 2B also illustrate a triangular die attach pad (204 and 204'). The die attach pad is necessary for mounting the die, in some packaging techniques. In cases where the die attach pad is used, the shape of the die attach pad will conform with (be similar to) the shape of the die-receiving area, which preferably conforms to the shape of the die mounted in the die-receiving area.

FIGS. 2A and 2B show a generalized triangular die-receiving area having three angles: alpha ($\alpha$), beta ($\beta$) and phi ($\phi$).

In the case of these three angles defining an equilateral triangular shape for the die-receiving area (i.e., $\alpha=60°$, $\beta=60°$, $\phi=60°$), the ratio of Perimeter:Area (P:A) for a die-receiving area having an area of one unit$^2$ is P:A=4.56:1, or 14% more perimeter than the (same unit$^2$ area) square die-receiving area discussed above.

Figure 13B:
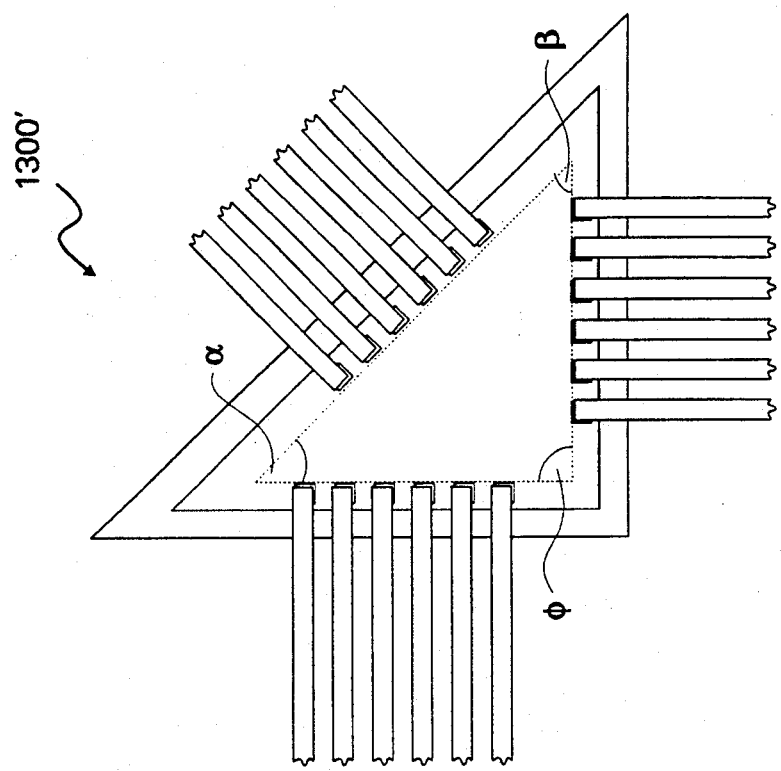
FIG. 13B is a plan view diagrammatic representative of a patterned layer of conductive lines, similar to FIG. 2B, the inner ends of the conductive lines forming a 45°/45°/90° triangular die-receiving area, according to the present invention, and employing a Tape Automate Bonding technique for connecting a die to the conductive lines.
Figure 13A:
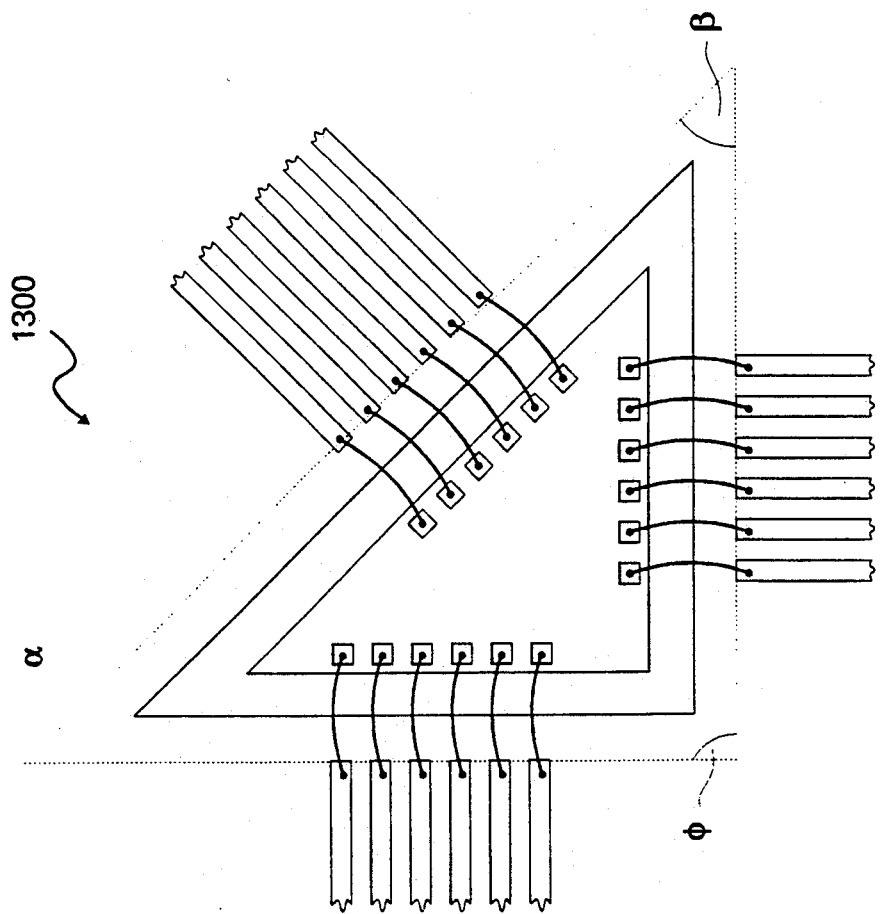
FIG. 13A is a plan view diagrammic representative of a patterned layer of conductive lines, similar to FIG. 2A, the inner ends of the conductive lines forming a 45°/45°/90° triangular die-receiving area, according to the present invention, and employing a wire bond technique for connecting a die to the conductive lines.

In the case (See, e.g., FIGS. 13A and 13B) of these three angles defining a right isosceles triangular shape for the die-receiving area (i.e., $\alpha=45°$, $\beta=45°$, $\phi=90°$), the ratio of Perimeter:Area (P:A) for a die-receiving area having an area of one unit$^2$ is P:A=4,828:1, or 20% more perimeter than the (same unit$^2$ area) square die-receiving area discussed above.

In the case (See, e.g., FIGS. 12A and 12B) of these three angles defining another right triangular shape for the die-receiving area (i.e., $\alpha=30°$, $\beta=60°$, $\phi=90°$), the ratio of Perimeter:Area (P:A) for a die-receiving area having an area of one unit$^2$ is P:A=5.085:1, or 27% more perimeter than the (same unit$^2$ area) square die-receiving area discussed above.

Therefore, a triangular die-receiving area 210, 210' will exhibit an increased ratio of perimeter to area (P:A), vis-a-vis a square die-receiving area. Hence, for conductive lines of given dimension, pitch and spacing, more conductive lines (and I/O connections) can be accommodated around the same size (die-receiving) area.

It will be evident that a similar increase in P:A can be obtained with other (than triangular) "certain non-square" die receiving areas, according to the present invention. Calculations for each are not necessary. Similar calculations, relating to the ratio of periphery:area for a die, can be found in the parent case.

Figure 3:
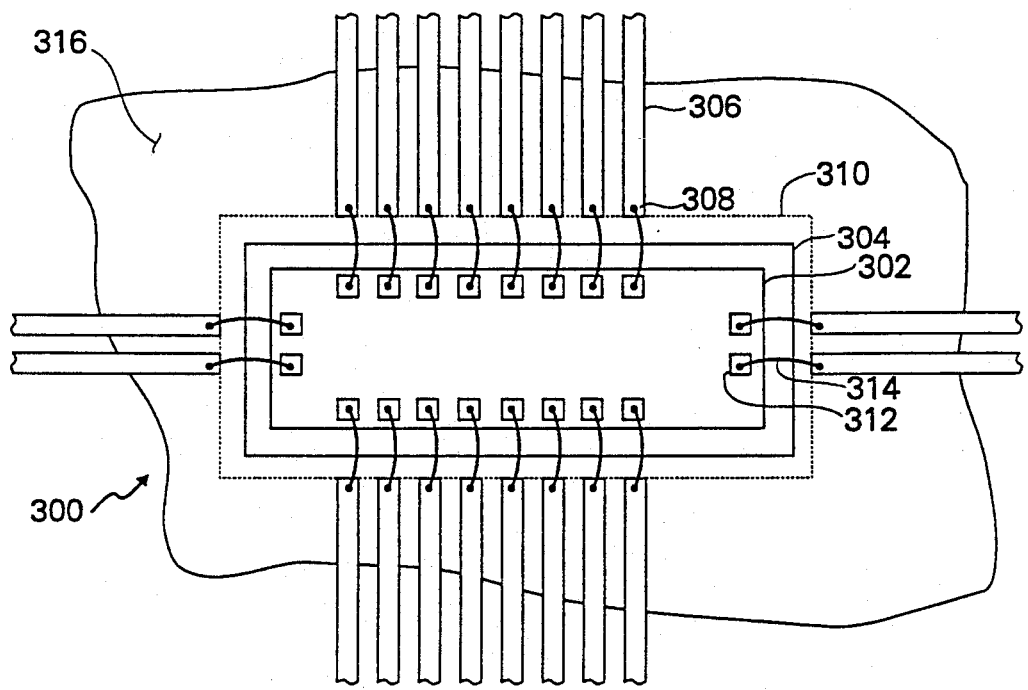
FIG. 3 is a plan view diagrammatic representation of a patterned layer of conductive lines, the inner ends of the conductive lines forming a "greatly elongated rectangular" shaped die-receiving area, according to the present invention, and employing a wire bonding technique (by way of example) for connecting a die to the conductive lines.

FIG. 3 shows an alternate embodiment 300 of the present invention, wherein the "certain non-square" die-receiving area is "greatly elongated rectangle" shaped. In this, and in subsequent examples, only wire bonding is shown. It should be understood throughout the descriptions of the present invention that any suitable technique can be used to connect a die to conductive lines, including wire bonding, TAB, flip-chipping, etc.

The greatly elongated rectangular die-receiving area 310 is defined by the inner ends 308 of conductive lines 306 radiating from the four sides of the die-receiving area. A die 302 is mounted within the die-receiving area 310 and bond pads 312 are connected to the conductive lines 306 by bond wires 314.

The conductive lines 306 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 304 (preferably conforming to the shape of the die and of the die-receiving area), and the die can be enclosed in a package body (not shown).

The perimeter to area ratio (P:A) for a greatly elongated rectangular die-receiving area of unit$^2$ area will be 4.62:1, which will accommodate 15% more conductive lines than a similar size prior art ( e.g. , square ) die-receiving area.

Figure 4:
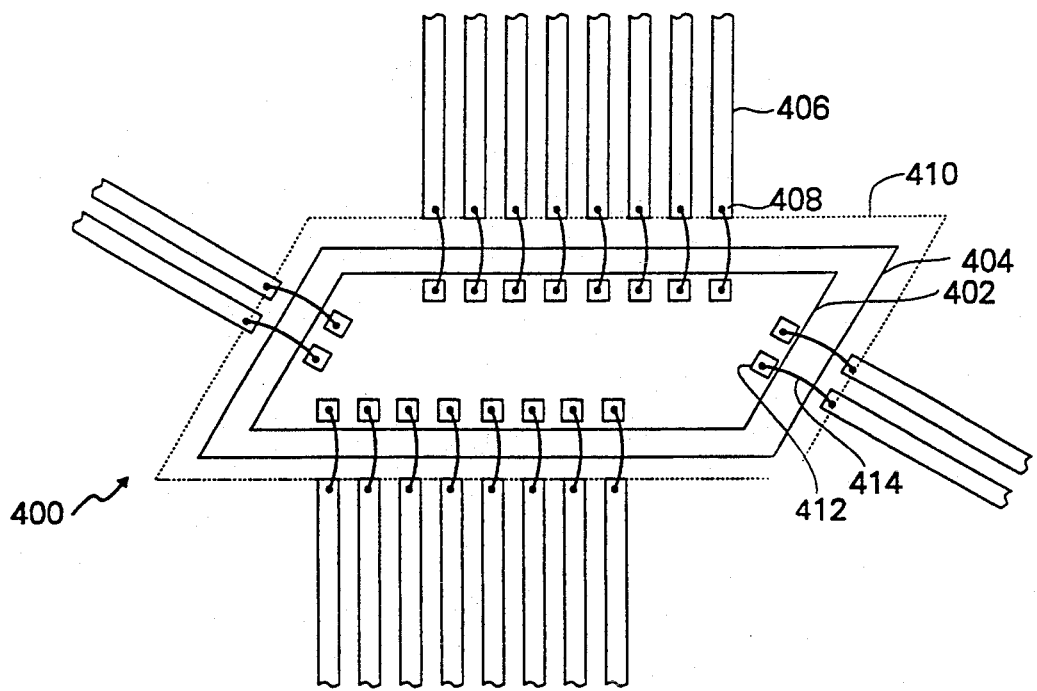
FIG. 4 is a plan view diagrammatic representation of a patterned layer of conductive lines, the inner ends of the conductive lines forming a parallelogram shaped die-receiving area, according to the present invention, and employing a wire bonding technique (by way of example) for connecting a die to the conductive lines.

FIG. 4 shows an alternate embodiment 400 of the present invention, wherein the "certain non-square" die-receiving area is parallelogram shaped. Again, only wire bonding is shown, by way of example.

The parallelogram shaped die-receiving area 410 is defined by the inner ends 408 of conductive lines 406 radiating from the four sides of the die-receiving area. A die 402 is mounted within the die-receiving area 410 and bond pads 412 are connected to the conductive lines 406 by bond wires 414.

The conductive lines 406 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 404 (preferably conforming to the shape of the die and of the die-receiving area), and the die can be enclosed in a package body (not shown).

The perimeter to area ratio (P:A) for the parallelogram shaped die-receiving area of unit$^2$ area will be 4.56:1, which will accommodate 14% more conductive lines than a similar size prior art (e.g., square) die-receiving area.

Figure 5:
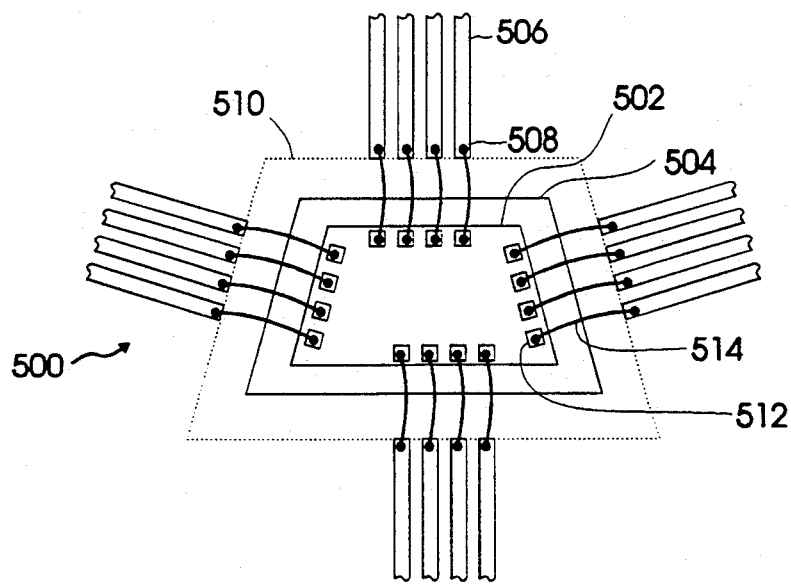
FIG. 5 is a plan view diagrammatic representation of a patterned layer of conductive lines, the inner ends of the conductive lines forming a trapezoidal shaped die-receiving area, according to the present invention, and employing a wire bonding technique (by way of example) for connecting a die to the conductive lines.

FIG. 5 shows an alternate embodiment 500 of the present invention, wherein the "certain non-square" die-receiving area is trapezoidal shaped. Again, only wire bonding is shown, by way of example.

The trapezoidal shaped die-receiving area 510 is defined by the inner ends 508 of conductive lines 506 radiating from the four sides of the die-receiving area. A die 502 is mounted within the die-receiving area 510 and bond pads 512 are connected to the conductive lines 506 by bond wires 515.

The conductive lines 506 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 505 (preferably conforming to the shape of the die and of the die-receiving area), and the die can be enclosed in a package body (not shown).

The perimeter to area ratio (P:A) for the trapezoidal shaped die-receiving area of unit$^2$ area will greater than for a similar size prior art (e.g., square) die-receiving area.

SEMICONDUCTOR PACKAGE HAVING NON-SQUARE DIE-RECEIVING AREA

Figure 6:
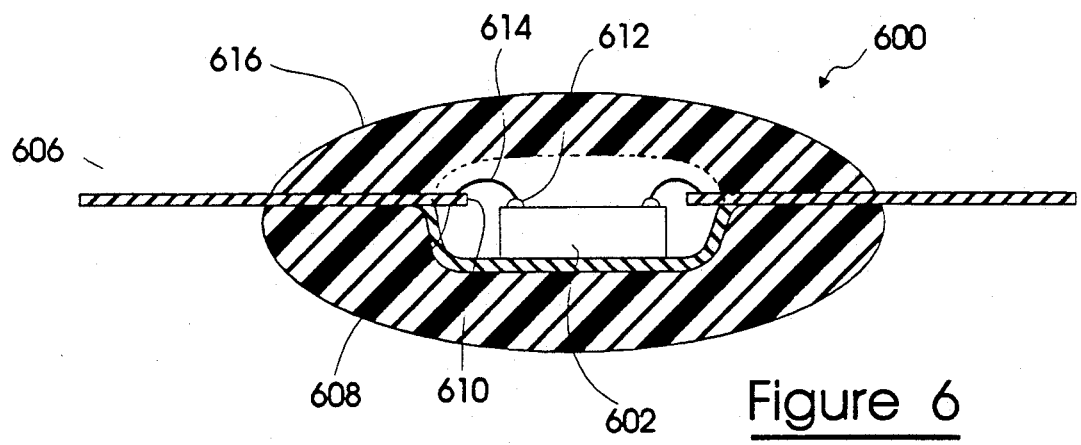
FIG. 6 is a cross-sectional view of a plastic molded semiconductor package enclosing a die mounted to a die attach pad (paddle) within a corresponding die-receiving area defined by inner end leads according to the present invention.

FIG. 6 shows plastic molded semiconductor package 600, including one layer of conductive lines defining a "certain non-square" die-receiving area, as set forth above in any of FIGS. 2A, 2B, 3, 4 or 5 (for example). Preferably, the die 602 conforms to the shape of the die-receiving area (i.e., a triangular die in a similar triangular die-receiving area). In this example, the die 602 is mounted to a die attach paddle 604, and is wire bonded (by way of example) to the inner ends 608 of lead frame conductive leads 606. The die 602 and inner portions of the conductive leads 606 are encapsulated in a plastic body 616. Outer portions of the conductive leads extend outside the plastic body for making connections to external systems (not shown).

Figure 7:
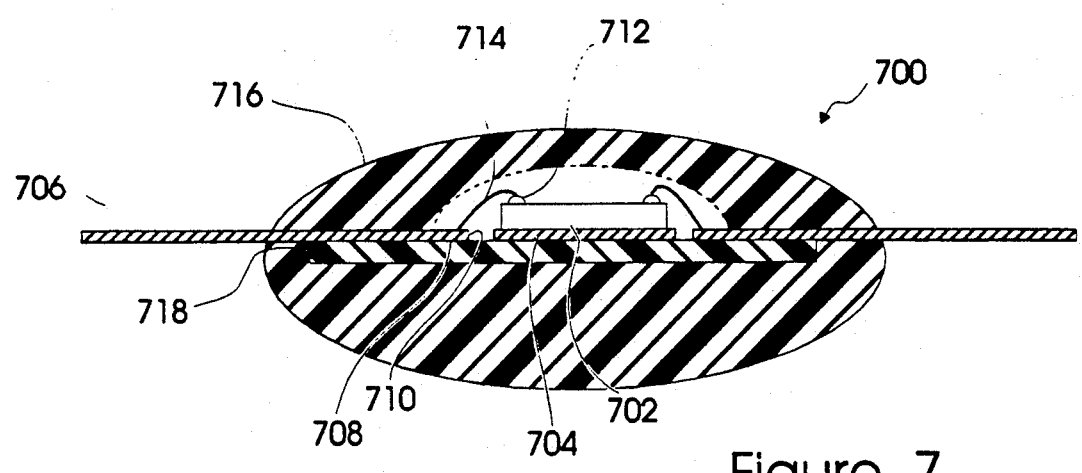
FIG. 7 is a cross-sectional view of a tape-based, by way of example plastic molded, semiconductor package enclosing a die mounted on a tape substrate within a corresponding die-receiving area defined by inner end leads according to the present invention.

FIG. 7 shows tape-based semiconductor package 700, including one layer of conductive lines defining a "certain non-square" die-receiving area, as set forth above in any of FIGS. 2A, 2B, 3, 4 or 5 (for example). Preferably, the die 702 conforms to the shape of the die-receiving area (i.e., a triangular die in a similar triangular die-receiving area). In this example, the die 702 is mounted to a die attach pad 704, and is wire bonded (by way of example) to the inner ends 708 of conductive leads 706 supported by an underlying plastic layer 718. In this example, the die 702 and inner portions of the conductive leads 706 are encapsulated in a plastic body 716, although tape-based packages may be packaged in other manners. Outer portions of the conductive leads extend outside the plastic body for making connections to external systems (not shown).

Figure 8:
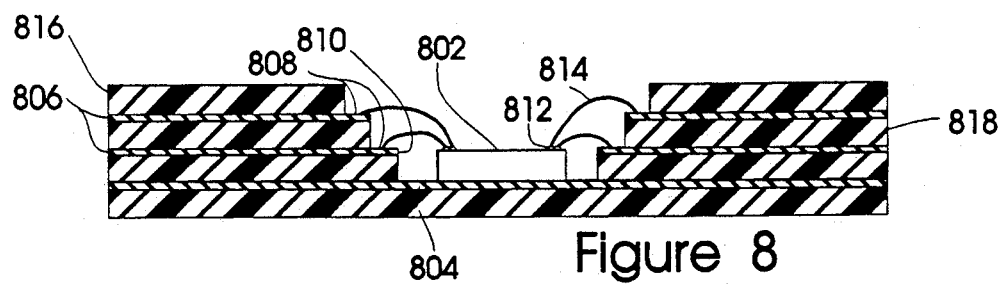
FIG. 8 is a cross-sectional view of a ceramic semiconductor package enclosing a die in the die-receiving area defined by the inner end traces of a conductive layers according to the present invention.

FIG. 8 shows a ceramic semiconductor package 800, including two layers of conductive lines, each defining a "certain non-square" die-receiving area, as set forth above in any of FIGS. 2A, 2B, 3, 4 or 5 (for example). Preferably, the die 802 conforms to the shape of the die-receiving areas (i.e., a triangular die in a similar triangular die-receiving area). In this example, the die 802 is mounted to a die attach area 804, and is wire bonded (by way of example) to the inner ends 808 of conductive leads 806 separated by an interleaved ceramic layer 818. Wire bonds 814 connect the die to the inner ends 808 of the conductive trace 806. The inner ends 808 of the conductive traces 806 define a certain non-square die-receiving area 810 according to the present invention. The ceramic layer 818 also defines a similar shaped area. As is evident in FIG. 8, a cavity extends into the surface of the ceramic package. This cavity may be "up" or "down" depending on the orientation of pins, for example (not shown). In a cavity-down ceramic package, pins would be located on the same side of the package as the cavity. The cavity is eventually sealed by a lid (not shown).

Figure 8A:
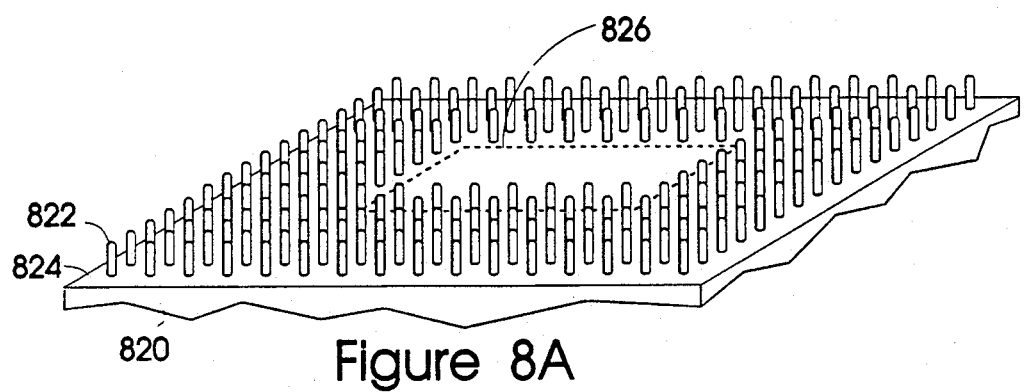
FIG. 8A is a bottom view of a semiconductor package, by way of example the ceramic package of FIG. 8, the ceramic package having a pin grid array for external connections to the package.
Figure 8B:
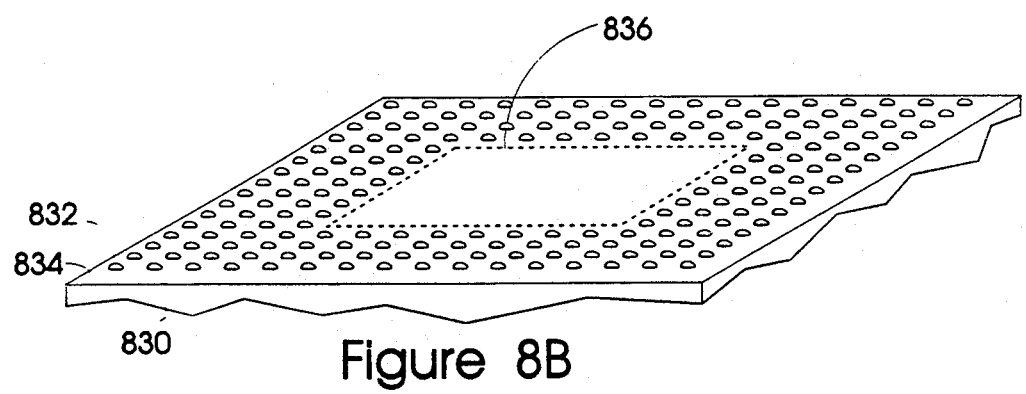
FIG. 8B is a bottom view of a semiconductor package, by way of example the ceramic package of FIG. 8, the ceramic package having a ball bump grid array for external connections to the package.
Figure 8C:
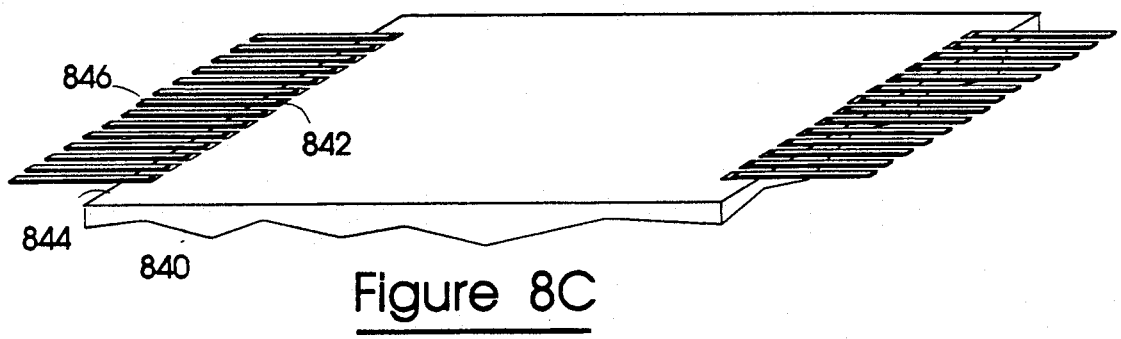
FIG. 8C is a bottom view of a semiconductor package, by way of example the ceramic package of FIG. 8, the ceramic package having external leads providing external connections to the package.

FIGS. 8A–8C illustrate three different bottom views of semiconductor packages.

FIG. 8A shows the bottom side of a generic semiconductor package 820, ceramic for example, having an array of pins 822 disposed on an exterior surface 824 of the package. This is referred to as a "pin grid array". The pins are connected, internally in the package, to the conductive lines (e.g., traces 806). In the case where the pins 822 cover substantially the entire surface 824 of the package 820, this is referred to as "fully populated". In the case (e.g., cavity down) where there are no pins in a central area 826 of the exterior surface 824, this is referred to as "partially populated".

FIG. 8B shows the bottom side of a generic semiconductor package 830, ceramic for example, having an array of ball bumps 832 disposed on an exterior surface 834 of the package. This is referred to as a "ball bump grid array". The ball bumps are connected, internally in the package, to the conductive lines (e.g., traces 806). In the case where the ball bumps 832 cover substantially the entire surface 834 of the package 830, this is referred to as "fully populated". In the case (e.g., cavity down) where there are no pins in a central area 836 of the exterior surface 834, this is referred to as "partially populated".

FIG. 8C shows the bottom side (external surface) of a "generic" semiconductor package 840, ceramic for example, having bond pads 842 arranged about the periphery of an exterior surface 844 of the package. Rigid leads 846 are bonded to the pads 842. This is referred to as a "leaded" package. The pads 842 are connected, internally in the package, to the conductive lines (e.g., traces 806).

Other packaging techniques, such as tape flat pack are known, and are included within the scope of the invention.

Figure 9:
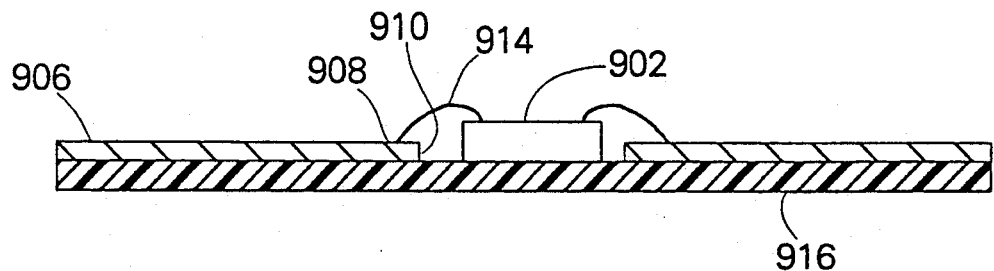
FIG. 9 is a cross-sectional view of a PCB-substrate packaging technique for mounting a die in the die-receiving area defined by inner end conductive layer traces, according to the present invention.

As discussed hereinabove, dies can also be packaged according to PCB-substrate techniques. FIG. 9 shows a certain non-square die 902 mounted on a printed circuit board substrate 916, and the die is shown connected with bond wires 914 to inner ends 908 of conductive traces 906 on the substrate. The inner ends of the conductive traces define a "certain non-square" die receiving area 910, as discussed above. As discussed above, the die may be TABbed or flip-chipped to conductive traces on a PCB-substrate. Typically, the die and inner end portions of the traces will be covered (not shown) by glob-top epoxy or covers such as molded plastic, metal, and the like. The PCB-substrate is formed of a suitable insulating material such as FR4 resin, BT resin, teflon or polyimide.

FIGS. 2A, 2B and 3–9 are provided only for illustrative purpose of the teachings of the present invention. They are not intended to limit the invention to the illustrations, rather to provide a sample of an embodiment of the invention. Modifications within the scope of this invention are deemed included.

CERTAIN "NON SQUARE" SEMICONDUCTOR PACKAGING

As discussed hereinabove, "certain non-square" die-receiving areas formed by the inner ends of conductive lines provide for additional I/O connections for a given size die-receiving area, and this principle applies to various types of packaging. It has also been discussed that a die attach pad (if any) would preferably be shaped similar to the die-receiving area defined by the inner ends of the conductive lines. It has also been discussed that the shape defined by the inner ends of the conductive lines is preferably similar to the shape of the die mounted within the die-receiving area.

Figure 10:
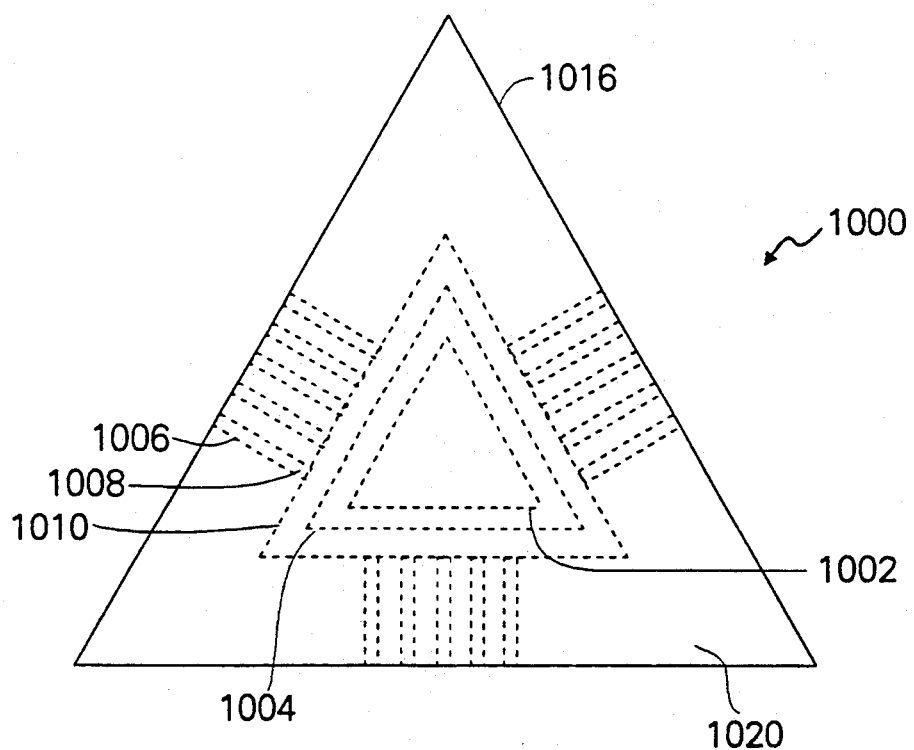
FIG. 10 is a plan view of a semiconductor device assembly, according to the present invention, having a "certain non-square" external configuration, triangular by way of example.

FIG. 10 shows an exemplary semiconductor device assembly 1000, having a "certain non-square" package body 1020—in other words, a "certain non-square" external configuration. Shown in dashed lines are a die 1002, a die attach pad 1004, conductive lines 1006 and inner ends 1008 of the conductive lines, all similar to that shown in FIG. 2A, by way of example. A noteworthy feature of the package body 1020 is that it is preferably shaped similar to the die, die attach pad (if any), and die-receiving area formed by the inner ends of the conductive lines. As shown, all of these elements are triangular, but they could be any of the other "certain non-square" shapes discussed above, employing any of the packaging techniques discussed above, and using any of the techniques for connecting the die to the conductive lines discussed above.

FIGS. 11A, 11B, 11C and 11D illustrate how "certain non-square" packages, for example the package 1000 of FIG. 10, can be laid out on a printed circuit mother board with great efficiency vis-a-vis utilizing the available space on the mother board. This is similar, in some respect, to the wafer-layout-efficiency issue addressed in the parent case (U.S. Pat. No. 916,328).

Figure 11A:
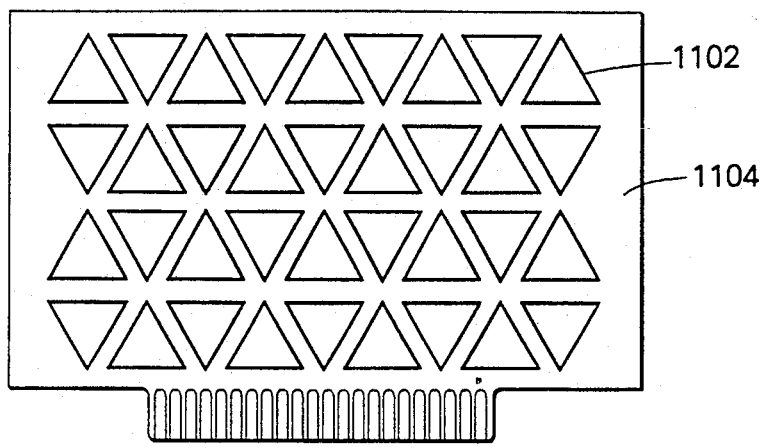
FIG. 11A is a plan view of mounting a number of triangular semiconductor packages on a printed circuit "mother" board, according to the present invention. As employed herein, the term "printed circuit mother board" refers to any circuit board, or the like, used to mount the semiconductor package of the present invention and (usually) other additional electronic components.
Figure 11B:
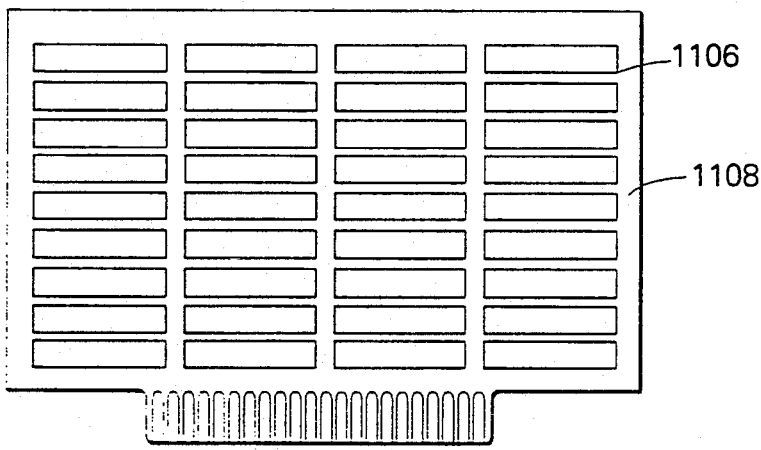
FIG. 11B is a plan view of mounting a number of greatly elongated rectangular semiconductor packages on a printed circuit mother board, according to the present invention.
Figure 11C:
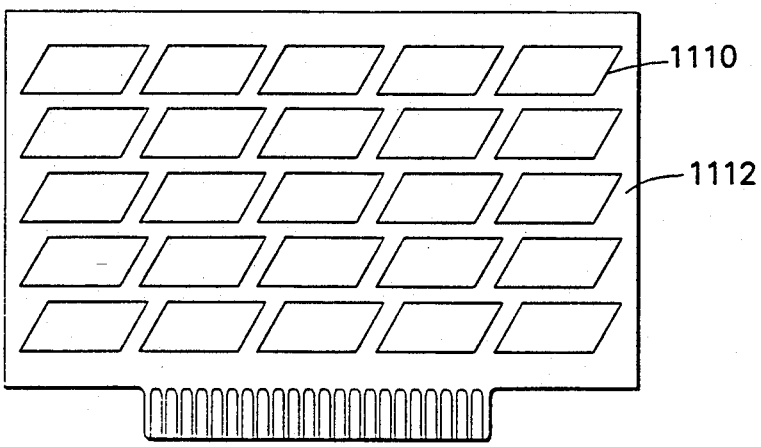
FIG. 11C is a plan view of mounting a number of parallelogram shaped semiconductor packages on a printed circuit mother board, according to the present invention.
Figure 11D:
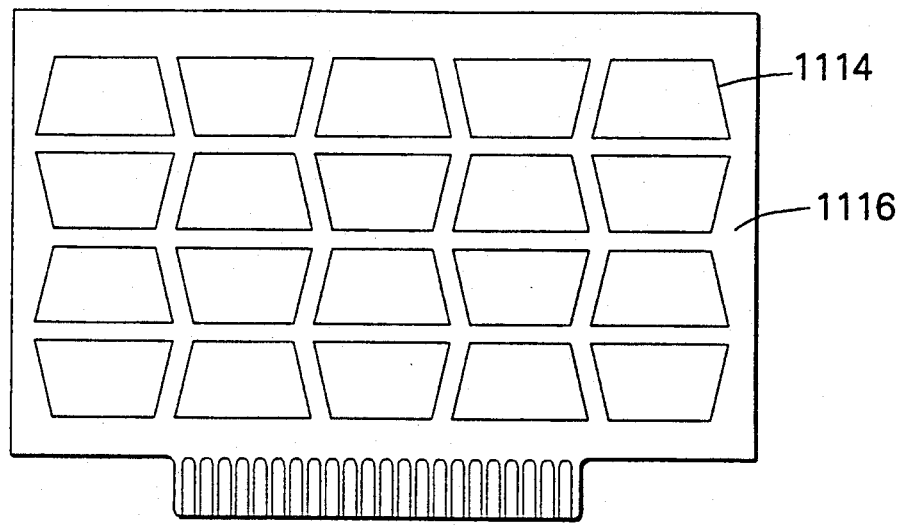
FIG. 11D is a plan view of mounting a number of trapezoidal shaped semiconductor packages on a printed circuit mother board, according to the present invention.

In FIG. 11A, a number of triangular packages 1102 are laid out on a mother board 1104. In FIG. 11B, a number of "greatly elongated rectangular" packages 1106 are laid out on a mother board 1108. In FIG. 11C, a number of parallelogram shaped packages 1110 are laid out on a mother board 1112. In FIG. 11D, a number of trapezoidal shaped packages 1114 are laid out on a mother board 1116. The boards and semiconductor packages of FIGS. 11A-11D are each referred to as an "electronic system".

Figure 11E:
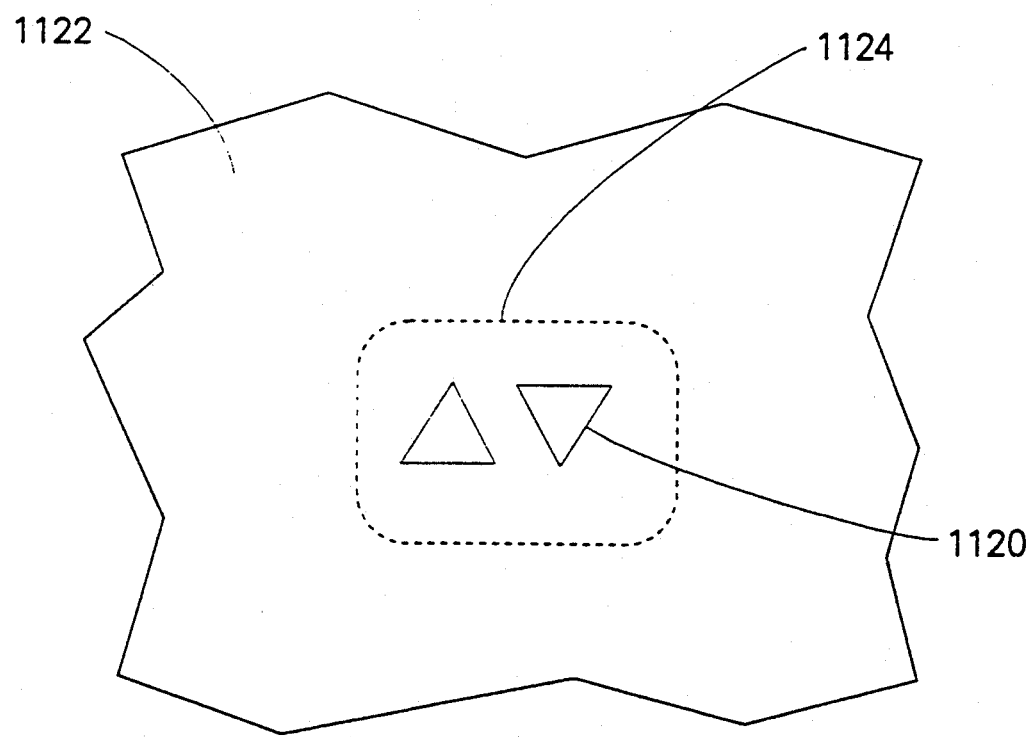
FIG. 11E is a plan view of mounting a number of triangular dies to a printed circuit mother board, forming a "multi-chip module" according to the present invention

FIG. 11E shows a technique similar to that of FIGS. 11A–11D, except that in this case, individual dies 1120 are mounted unpackaged to a substrate 1122 having a series of conductive lines (not shown). As in the previous examples, the inner ends of the conductive lines form "certain non-square" die-receiving areas, and the die is connected to the conductive lines in any suitable manner. The dashed line 1124 indicates that the dies may be globbed over (covered) with epoxy or the like (not shown). In this manner, a "multi-chip module" is formed.

What is claimed is:

1. A patterned layer of conductive lines defining a die-receiving area for packaging a semiconductor die, comprising:
   a plurality of conductive lines, said conductive lines having inner ends;
   the inner ends of said conductive lines defining a certain non-square die-receiving area for mounting a semiconductive die;
   wherein:
   the geometric configuration formed by the inner ends of the conductive lines define a triangular shaped die-receiving area, said die-receiving area having angles alpha, beta, and phi;
   the die-receiving area is a right isosceles triangle; and
   the angles alpha, beta and phi are 45°, 45°, and 90°, respectively.

2. A patterned layer of conductive lines, according to claim 1, further comprising:
   certain non-square a die attach pad for supporting the semiconductor die; wherein
   the die attach pad has a shape similar to the shape of the die-receiving area.

3. A patterned layer of conductive lines, according to claim 1, wherein:
   the conductive lines are lead frame leads.

4. A patterned layer of conductive lines, according to claim 1, wherein:
   the conductive lines are leads in a tape-based package.

5. A patterned layer of conductive lines, according to claim 1, wherein:
   the conductive lines are traces on a ceramic layer.

6. A patterned layer of conductive lines, according to claim 1, wherein:
   the conductive lines are traces on a PCB-substrate.

7. A patterned layer of conductive lines defining a die-receiving area for packaging a semiconductor die, comprising:
   a plurality of conductive lines, said conductive lines having inner ends;
   the inner ends of said conductive lines defining a certain non-square die-receiving area for mounting a semiconductor die; wherein:
   the geometric configuration formed by the inner ends of the conductive lines define a triangular shaped die-receiving area, said die-receiving area having angles alpha, beta, and phi;
   the die-receiving area is triangular; and
   the angles alpha, beta and phi are 30°, 60°, and 90°, respectively.

8. A patterned layer of conductive lines, according to claim 7, further comprising:
   a certain non-square die attach pad for supporting the semiconductor die; wherein:
   the die attach pad has a shape similar to the shape of the die-receiving area.

9. A patterned layer of conductive lines, according to claim 7, wherein:
   the conductive lines are lead frame leads.

10. A patterned layer of conductive lines, according to claim 7, wherein:
    the conductive lines are leads in a tape-based package.

11. A patterned layer of conductive lines, according to claim 7, wherein:
    the conductive lines are traces on a ceramic layer.

12. A patterned layer of conductive lines, according to claim 7, wherein:
    the conductive lines are traces on a PCB-substrate.

13. A patterned layer of conductive lines defining a die-receiving area for packaging a semiconductor die, comprising:
    a plurality of conductive lines, said conductive lines having inner ends;
    the inner ends of said conductive lines defining a certain non-square die-receiving area for mounting a semiconductor die; wherein:
    the geometric configuration formed by the inner ends of the conductive lines define a trapezoidal shaped die-receiving area.

14. A patterned layer of conductive lines, according to claim 9, further comprising:
    a die attach pad for supporting the semiconductor die; wherein:
    the die attach pad has a shape similar to the shape of the die-receiving area.

15. A patterned layer of conductive lines, according to claim 13, wherein:
    the conductive lines are lead frame leads.

16. A patterned layer of conductive lines, according to claim 13, wherein:
    the conductive lines are leads in a tape-based package.

17. A patterned layer of conductive lines, according to claim 13, wherein:
    the conductive lines are traces on a ceramic layer.

18. A patterned layer of conductive lines, according to claim 13, wherein:
    the conductive lines are traces on a PCB-substrate.

* * * * *